(12) United States Patent
Rupp

(10) Patent No.: US 6,198,579 B1
(45) Date of Patent: Mar. 6, 2001

(54) PROCESS FOR THE CORRECTION OF NON-ROTATIONALLY-SYMMETRICAL IMAGE ERRORS

(75) Inventor: Wolfgang Rupp, Aalen (DE)

(73) Assignee: Carl-Zeiss-Stiftung (DE)

( * ) Notice: Subject to any disclaimer, the term of this patent is extended or adjusted under 35 U.S.C. 154(b) by 0 days.

(21) Appl. No.: 09/336,341

(22) Filed: Jun. 18, 1999

(30) Foreign Application Priority Data

Jun. 20, 1998 (DE) .............................................. 198 27 602

(51) Int. Cl.$^7$ ...................................................... G02B 7/01
(52) U.S. Cl. ............................................ 359/820; 359/819
(58) Field of Search ..................................... 359/819, 820, 359/822, 823

(56) References Cited

U.S. PATENT DOCUMENTS

| | | | |
|---|---|---|---|
| 5,099,355 | 3/1992 | Tomita | 359/264 |
| 5,243,611 | * 9/1993 | Hyuga et al. | 372/22 |
| 5,353,292 | 10/1994 | Motegi | 372/21 |
| 5,668,826 | * 9/1997 | Bezinge et al. | 372/43 |
| 5,671,307 | 9/1997 | Lauzon et al. | 385/37 |
| 5,805,271 | * 9/1998 | Unno | 355/30 |
| 5,813,233 | * 9/1999 | Okuda et al. | 62/3.7 |
| 5,883,704 | * 3/1999 | Nishi et al. | 355/67 |
| 5,966,938 | * 10/1999 | Nagakubo et al. | 62/3.2 |
| 6,115,107 | * 9/2000 | Nishi | 355/68 |

FOREIGN PATENT DOCUMENTS

| | | | |
|---|---|---|---|
| 0 532 236 A1 | 4/1992 | (EP) | G03F/7/20 |
| 0 678 768 A2 | 12/1995 | (EP) | G03B/27/53 |
| 120650 | 5/1995 | (JP) | G02B/7/04 |
| 07120650 | 12/1995 | (JP) | G02B/7/04 |
| WO 97/14077 | 4/1997 | (WO) | G03B/27/34 |
| WO 97/45902 | 4/1997 | (WO) | H01S/3/10 |

* cited by examiner

Primary Examiner—Georgia Epps
Assistant Examiner—Saeed Seyrafi

(57) ABSTRACT

In a process for the correction of non-rotationally-symmetrical image errors in an assembly, e.g., an objective with optical elements, particularly lenses, several Peltier elements are arranged on at least one of the optical elements, distributed over its periphery, and are differently driven electrically in order to act on the temperature distribution in the optical element. A respective temperature-conducting connection is provided between the Peltier elements and the optical element. The invention also relates to an objective with optical elements, particularly lenses, and Peltier elements.

20 Claims, 2 Drawing Sheets

PROCESS FOR THE CORRECTION OF NON-ROTATIONALLY-SYMMETRICAL IMAGE ERRORS

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The invention relates to a process for the correction of non-rotationally-symmetrical image errors in an assembly with optical elements. The invention furthermore relates to an objective with optical elements, particularly lenses, and with a cooling device. Furthermore, the invention relates to a projection exposure device for microlithography.

2. Discussion of Relevant Art

It is known that lens heating effects lead, among other things, to non-rotationally-symmetrical temperature distributions in optical elements, particularly in lenses for semiconductor lithography objectives. Non-rotationally-symmetrical temperature distributions give rise to image errors, however, such as astigmatism in the axis and anamorphism in the distortion ($\Delta\beta$).

A static state of a non-rotationally-symmetrical temperature distribution could be corrected by suitable geometric arrangements of heat-sinking contact places, particularly on the lens periphery. However, it was found that the lens heating effects have a very marked dynamic behavior. In particular, the amplitudes of the effects are very strongly time-dependent, while the time constants are relatively long, and indeed are of the order of several minutes. For this reason, it is necessary to provide a dynamic or variably adjustable temperature distribution which can quickly and reliably oppose the non-rotationally-symmetrical temperature distributions in the optical element, in order to eliminate the said optical image errors.

Measures for the correction of rotationally asymmetric optical effects due to irradiation are already known from U.S. Pat. No. 5,805,273 European Patent EP 0 678 768. There are named for this purpose, among other things, measures for the production of rotationally symmetrical temperature distributions, for which cooling and heating devices, e.g., resistance wires and gas streams, are proposed. The production of rotationally symmetrical temperature distributions is however not an unconditional prerequisite for being able to compensate lens heating effects. The prior art device is however firstly relatively intricate and costly, and secondly, does not permit sufficient dynamics as regards changes of the temperature distribution.

SUMMARY OF THE INVENTION

The present invention therefore has as its object to provide a process for the correction of non-rotationally-symmetrical image errors with an assembly, for example, an objective with optical elements, whereby dynamic or variably adjustable temperature distributions can be produced in an optical element with simple measures, for the compensation of the negative lens heating effects, wherein these temperature distributions are to be quickly and reliably attained with simple measures.

According to the invention, this object is attained by the following process steps: arranging a plurality of Peltier elements distributed over the periphery of at least one optical element, electrically driving said Peltier elements differently from each other in order to affect a temperature distribution in said optical element, and providing heat-conducting connections between said Peltier elements and said optical element.

Namely it has been found in a surprising manner that Peltier elements are particularly suitable for the solution of the stated object, when they are used according to the measures according to the invention.

It is well known that in Peltier elements a current flow through a contact place between two different materials leads to a cooling of the contact place, and on the other hand reversal of the current flow leads to a heating of the contact place.

It is indeed already known to make use of this effect of Peltier elements for the cooling of devices (see, e.g., WO 97/14077 for wafer chucks), but since the amount of heat to be carried away from a projection exposure device for microlithography is very large, namely in the region of watts, it was assumed that Peltier elements would not be sufficient to eliminate such lens heating effects.

It has however been found that with a corresponding number of Peltier elements in combination with specific driving, a dynamically adjustable temperature distribution can be quickly and reliably set such that the disadvantageous action of the lens heating effects can be eliminated. Also, the relatively high incident amount of heat can be carried away within a short time. Namely, it was established that the partially rapid dynamic behavior of the lens heating effects can be optimally countered by the specific controllability of Peltier elements and their bidirectional capability, i.e., their changeover between cooling and heating. Peltier elements can be changed over between cooling and heating by reversing the polarity of the electrical supply. This means that a very quick and exact reaction to temperature differences and changing temperature distributions can be effected without the interposition of mechanically movable components.

The process according to the invention enables the desired temperature distributions to be quickly and reliably attained with simple measures. This is in particular the case when only given image errors, e.g., image errors of low order, are to be corrected.

A further very important advantage of the invention is that if needed, "over-compensations" and the additional compensation of manufacturing errors are possible. Instead of symmetrizing several lenses, as it the case according to the state of the art, individual lenses can also be "over-compensated", i.e., the temperature distribution or deformation can intentionally be made asymmetrical "in another direction". An overall compensation of the whole objective or of the exposure device results in this manner.

As regards the compensation of manufacturing errors, there are two variants, namely a simultaneous compensation of accidental manufacturing errors and an intentional introduction of a fixed offset, in order to halve the required amounts of correction.

A simultaneous compensation of lens heating and of compaction effects of the optical element is also possible with the process according to the invention.

A constructive solution for carrying out the process according to the invention in an assembly, e.g., an objective with optical elements, particularly lenses, is a temperature adjusting device comprising a plurality of Peltier elements distributed over the periphery of at least one of optical element and electrically driven differently from each other, and heat-conducting connecting members arranged between said Peltier elements and said optical element.

The Peltier elements can be thereby arranged regularly or else irregularly over the periphery of the optical element. It is important that they are optionally or differently driven electrically, in order to be able to affect the temperature distribution in the optical element in the desired manner. It is then solely necessary to take care that connecting members of very good thermal conducting properties are provided between the Peltier elements and the optical element, so that a good conduction of heat or cold is attained between the Peltier elements and the optical element.

Various solutions are conceivable for the embodiment of the heat-conducting connecting members. The mount or holder of the optical element can be used in a simple manner for this purpose. It is likewise also possible to arrange the Peltier elements separately from a mount or holder and to provide corresponding heat-conducting connecting members between the Peltier elements and the optical element.

The Peltier elements are additionally provided with corresponding heat coupling members to carry off the removed heat to the exterior.

BRIEF DESCRIPTION OF THE DRAWING

Advantageous embodiments of the invention will become apparent from the following detailed description, which are described in principle with reference to the accompanying drawings, in which.

DETAILED DESCRIPTION OF PREFERRED EMBODIMENTS

Figure 1:
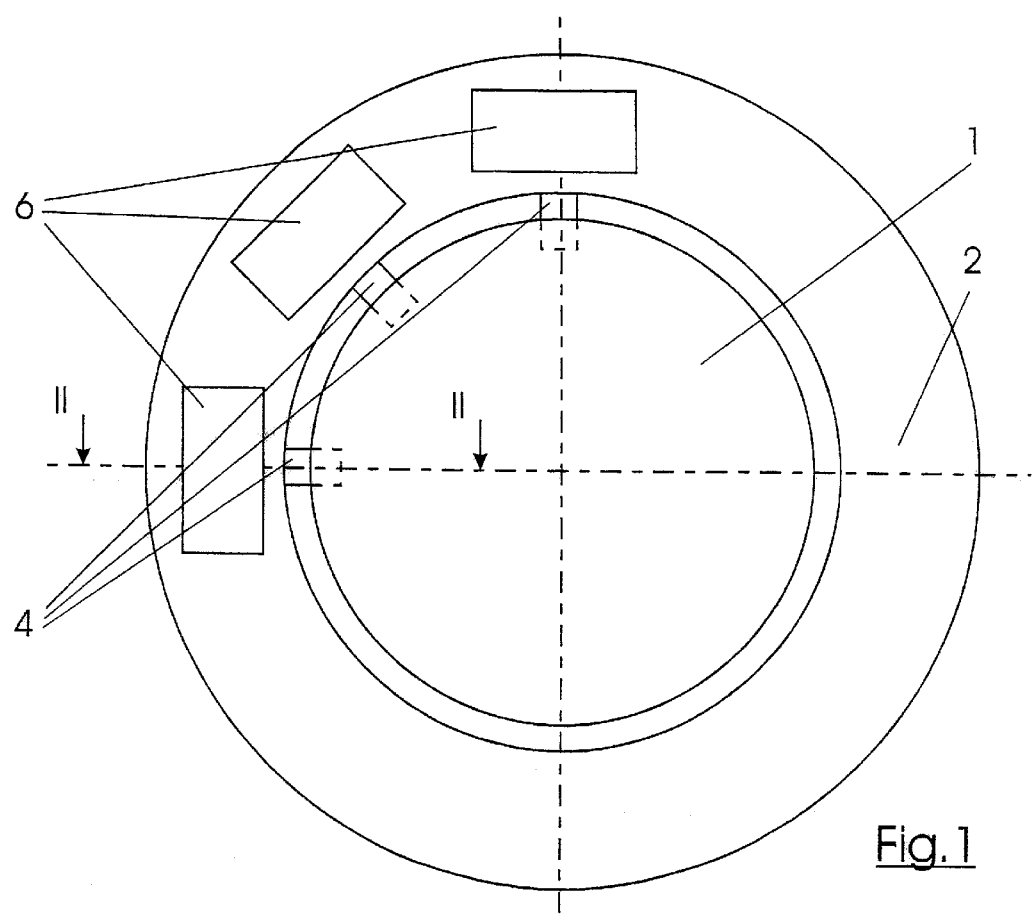
FIG. 1 shows a lens as the optical element of an objective, wherein Peltier elements are arranged on a mount of the lens (without heat coupling members)

A lens 1 as the optical element is arranged in a known manner by means of a mount or holder 2 in an objective 3 (not shown in further detail), only a wall section of which is shown. The mount 2 is provided with several lens supports 4 which are distributed over the perimeter and by means of which the lens 1 is held in connection with an adhesive 5.

A number of Peltier elements 6 are arranged at or on the mount 2, distributed over the periphery of the mount 2, and are provided with + and − current connections 7 and 8. A respective heat coupling member 9 is provided on the side of the Peltier element 6 remote from the mount 2, and heat is carried away through it to the exterior. A cooling effect takes place on the side of the Peltier element directed toward the mount 2, corresponding to the magnitude of the input current or voltage at any given time, and is conducted into the lens 1 via the lens supports 4. Since the Peltier elements are respectively driven in groups or individually with different current or voltage values, the temperature distribution in the lens 1 can be acted on in an optimal manner, so as to compensate the non-rotationally-symmetrical temperature distributions produced by the lens heating effects. The reaction to changing temperature distributions in the lens 1 can be even more rapid by means of an additional changeover facility of the polarity of individual or several Peltier elements 6. Namely, with a corresponding changeover, a heating action by individual Peltier elements can also be produced via the mount 2 on the associated lens support 4 there, in the direction toward the lens 1.

Because of this high variability of the Peltier elements 6 (cooling/heating adjustable via polarity of the voltage and the current magnitudes), optional temperature profiles, that is, not only rotationally symmetrical profiles, can be set, so that the optical action of the optical element, in this case the lens 1, can be variably adjusted according to the present adjusted temperature distribution; for example, astigmatic action with optional amplitude and direction, but also compensation or over-compensation of a (dynamic) astigmatism.

Furthermore, if needed, asymmetrical profiles can if necessary be set, possibly for offset relative to other lens elements in the objective, for the compensation of off-axis fields, or for the compensation of errors in the homogeneity of manufacturing.

Figure 2:
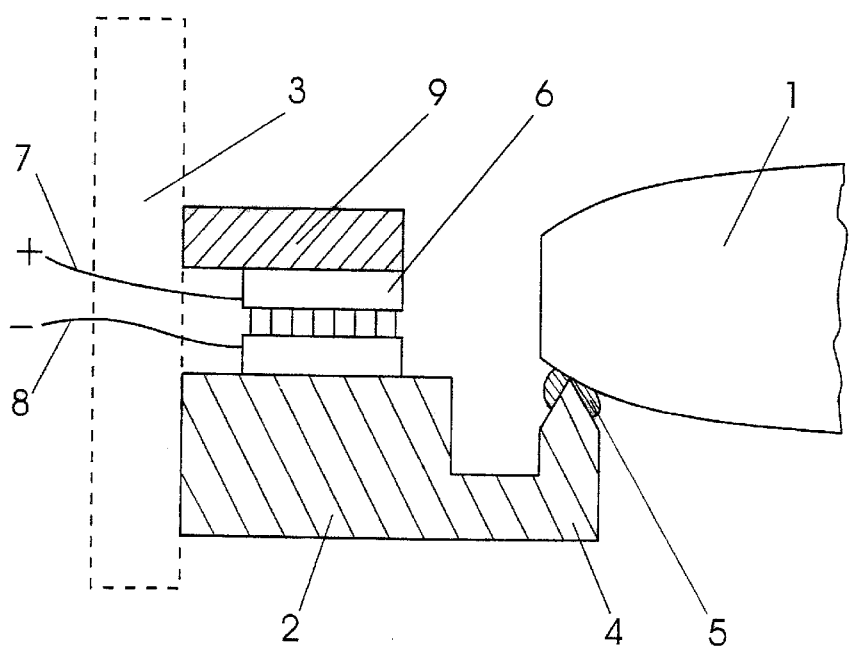
FIG. 2 shows a section along line II—II of FIG. 1.

In the embodiment examples according to FIGS. 1 and 2, in which the mount 2 takes on the additional function of a heat-conducting connecting member, possible disturbing forces on the lens are indeed produced by the Peltier elements 6; the reaction to temperature differences is of course only slow and with little sensitivity.

Figure 3:
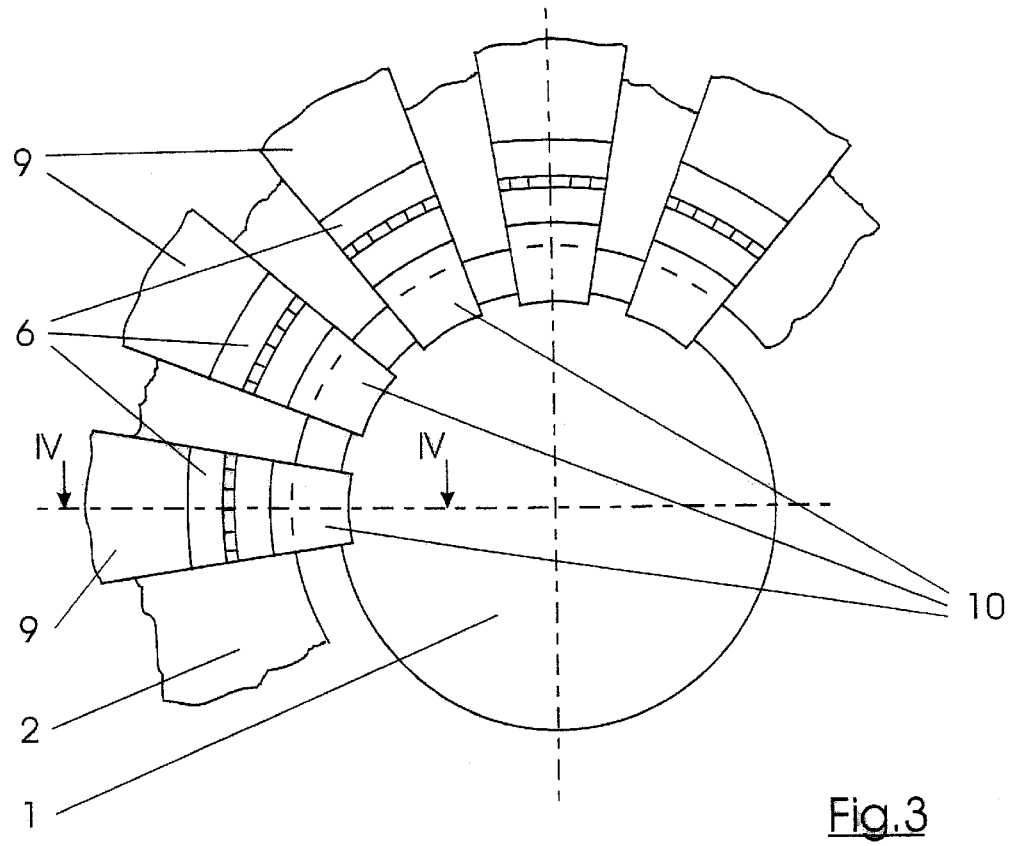
FIG. 3 shows a lens as the optical element of an objective, with Peltier elements coupled directly to the lens.
Figure 4:
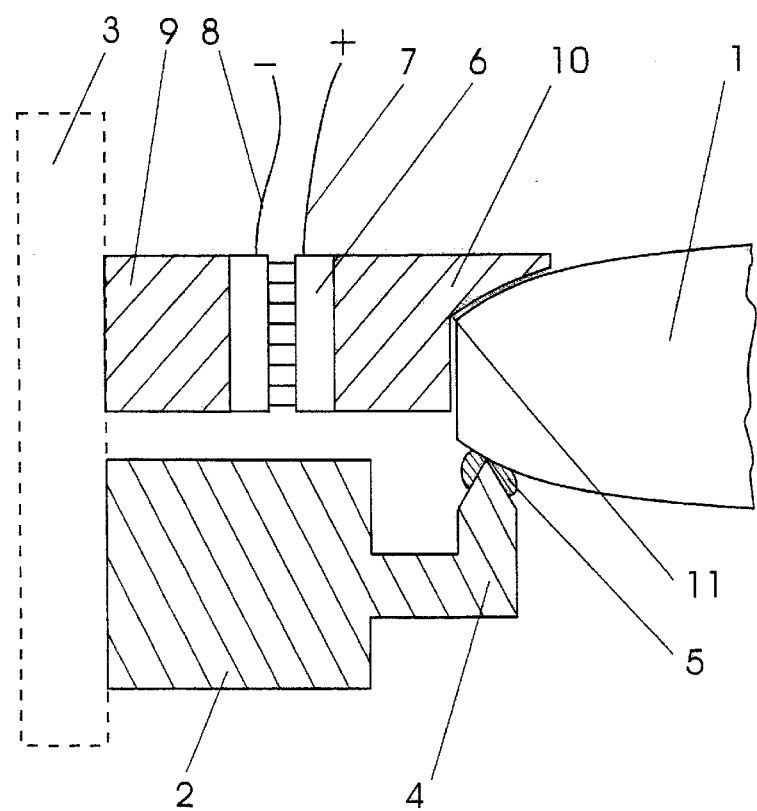
FIG. 4 shows a section along the line IV—IV of FIG. 3.

In the embodiment according to FIGS. 3 and 4, a constitution is shown in which the Peltier elements are directly coupled to the lens 1, so that even small temperature differences can be reacted to very quickly and sensitively.

As can be seen, the Peltier elements 6 are arranged independently of the mount and the lens supports 4 in this case. For this reason, separate heat-conducting connecting members 10 are provided between the Peltier elements 6, which are distributed around the periphery of the lens 1, and the lens 1, and produce a correspondingly good contact between these two parts. A respective heat coupling member 9 is provided on the sides of the Peltier elements 6 remote from the heat-conducting connecting members 10, and corresponds to the heat coupling member 9 according to the embodiment example according to FIGS. 1 and 2, to carry heat away to the exterior.

As is evident form FIG. 4, the connecting members 10 can be provided on their sides remote from the lens supports 4 with lugs 11 directed toward the lens 1 whereby firstly, the heat or cold transfer surface is enlarged, and secondly, an additional frame is provided for the lens.

I claim:

1. A process for correction of non-rotationally-symmetrical image errors in an assembly with optical elements comprising the steps of:

arranging a plurality of Peltier elements distributed over the periphery of at least one optical element, electrically driving said Peltier elements differently from each other in order to affect a temperature distribution in said optical element, and providing heat-conducting connections between said Peltier elements and said optical element.

2. The process according to claim 1, further comprising selectively cooling and heating said optical element by said Peltier elements.

3. An assembly having optical elements and a temperature adjusting device comprising a plurality of Peltier elements distributed over the periphery of at least one optical element and electrically driven differently from each other, and heat-conducting connecting members arranged between said Peltier elements and said optical element.

4. The assembly according to claim 3, in which said Peltier elements are provided with outward-directed heat coupling members.

5. The assembly according to claim 3, in which said Peltier elements are arranged on a mount or holder of said optical element.

6. The assembly according to claim 4, in which said Peltier elements are arranged on a mount or holder of said optical element.

7. The assembly according to claim 5, in which said mount or holder comprises a heat-conducting connecting member.

8. The assembly according to claim 6, in which said mount or holder comprises said heat-conducting connecting member.

9. The assembly according to claim 4, in which said mount or holder is provided with a lens support in a region of at least one of said Peltier elements that forms said heat-conducting connecting member.

10. The assembly according to claim 3, in which said Peltier elements are thermally coupled directly to said optical element by a plurality of heat coupling members arranged between said Peltier elements and said optical element,
    said heat coupling members having no mechanical support function.

11. The assembly according to claim 4, in which said Peltier elements are thermally coupled directly to said optical element by a plurality of heat coupling members arranged between said Peltier elements and said optical element.

12. The assembly according to claim 9, in which said Peltier elements are provided with outward-directed heat coupling members on sides of said Peltier elements remote from said optical element.

13. The assembly according to claim 10, in which said heat coupling members are provided with lugs directed toward said optical element.

14. The assembly according to claim 11, in which said heat coupling members are provided with lugs directed toward said optical element.

15. The assembly according to claim 3, in which said assembly comprises an objective for microlithography.

16. The assembly according to claim 15, in which said objective comprises a projection objective.

17. The assembly according to claim 4, in which said assembly comprises an objective for microlithography.

18. A projection exposure device for microlithography, comprising an assembly according to claim 3.

19. A projection exposure device for microlithography, comprising an assembly according to claim 4.

20. A projection exposure device for microlithography, comprising an assembly according to claim 7.

* * * * *